Figure 1:
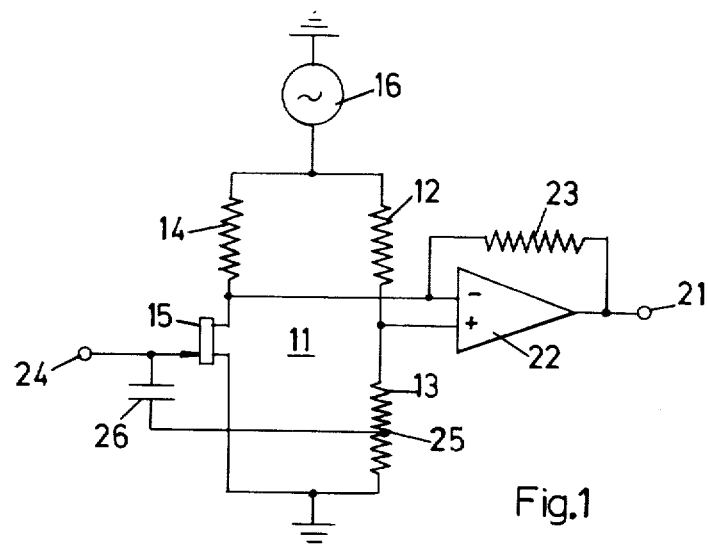

_United States Patent_ [19]

McCall

[11] 3,962,651
[45] June 8, 1976

[54] ANALOG A-C STORAGE CIRCUIT EMPLOYING A HIGH GAIN AMPLIFIER
[75] Inventor: Frank Boyes McCall, Midlothian, Scotland
[73] Assignee: Ferranti, Limited, England
[22] Filed: Apr. 15, 1975
[21] Appl. No.: 568,201

[30] Foreign Application Priority Data
Apr. 16, 1974 United Kingdom............. 16608/74

[52] U.S. Cl................................... 330/51; 307/264; 330/29; 330/35; 330/86
[51] Int. Cl.²......................................... H03F 1/14
[58] Field of Search................. 330/29, 35, 51, 86

[56] References Cited
UNITED STATES PATENTS
3,729,666    4/1973    Kelly................................. 330/35 X Primary Examiner—R. V. Rolinec
Assistant Examiner—Lawrence J. Dahl
Attorney, Agent, or Firm—Cameron, Kerkam, Sutton, Stowell & Stowell

[57] ABSTRACT

An analog store includes a four-arm resistance bridge in which the resistance of one arm is formed by the drain-source path of a field-effect transistor. The bridge is energised across one diagonal by an alternating voltage and the output is derived from the other diagonal through a high-gain amplifier. The input is applied to the gate of the field-effect transistor. A capacitor is connected between the gate of the field-effect transistor and biasing means.

6 Claims, 4 Drawing Figures

Fig.1

ANALOG A-C STORAGE CIRCUIT EMPLOYING A HIGH GAIN AMPLIFIER

This invention relates to analog stores for storing data of alternating current (AC) form.

The invention has particular application where it is desired to control on a time-sharing basis two or more AC systems — such as AC servos controlled by synchros and resolvers — from one command source, such as a digital computer, which supplies the command signals from system to system in a repetitive cyclic manner.

It has been proposed to provide each system with an AC signal store to retain in AC form the data last received from the command source, whether in AC form or in direct current (DC) form, until the data is renewed or updated by the source in its next output cycle.

It has also been proposed to use for the AC store of each system a bridge-like resistive network energised by an AC reference voltage of constant amplitude and frequency and including as a variable resistance element of the network the drain/source path of a field-effect transistor (FET) the effective resistance of which is controlled by a voltage applied to the FET from a capacitor connected between the gate and source electrodes and arranged to be charged, or have its charge modified, by the command source each time the system concerned is reached during a cycle.

The network is such that a departure of the FET resistance in one or other direction from a datum value under the control of the charge held by the capacitor produces an output from the network in the form of an AC signal at the fixed frequency of the reference voltage and at a phase with respect to it and at an amplitude dependent on the direction and extent of that departure. The output signal accordingly represents by its amplitude and phase the value of the data received from the command source and so acts effectively as an AC store.

Where the gain characteristic of the FET in such a system is not sufficiently linear, the store as described above may be included in a closed-loop AC servo, the output from the store being compared with the command signal and the resulting error signal, after demodulation and integration, applied to the capacitor.

Although such a servo is satisfactory for reducing the non-linearity of the gain characteristic, it cannot reduce errors due to the non-linear relationship between the resistance presented by the drain/source path of the FET and the voltage between the source and drain terminals. As that voltage is normally an AC voltage, being derived from the reference voltage which energises the network, such non-linearity gives rise to unwanted harmonic signals.

Though it is known that such non-linearity can be substantially reduced by biasing the gate electrode with respect to the source electrode by a voltage which is approximately equal to half that between the drain and source terminals, difficulties have been experienced in applying such corrective technique to a storage system where combined with others like it on a time-sharing basis as indicated above.

An object of the present invention is to provide a new and useful AC analog store of the kind which includes a network incorporating the drain/source path of an FET.

A further object is to provide such a store which is suitable for combination with like stores on a time-sharing basis and in which the above-mentioned difficulty of sufficiently avoiding undesired harmonics is to a large extent surmounted.

In accordance with the present invention, an analog store for producing an alternating output voltage of amplitude dependent on a command signal includes a four-arm resistance bridge in which the resistance of one arm is constituted by the drain/source path of a field-effect transistor and hence is variable in dependence on the Gate/source voltage, arrangements for energising the bridge across one diagonal by an alternating reference voltage, means for deriving the output from the bridge from the other diagonal by way of a high-gain negative-feedback amplifier so as to maintain the voltage between the drain and source terminals of the transistor equal to the voltage across the arm connected to the source terminal despite variations of the resistance of the drain/source path, a capacitor having one electrode connected to the said gate electrode, means for applying the command signal to that gate electrode, and biasing means for applying to the other electrode of the capacitor a voltage with respect to the source terminal of the transistor which is equal to half the voltage developed across the said arm connected to that terminal.

The biasing means may be a connection from the mid-potential point of said arm connected to the source terminal to the said other electrode of the capacitor direct.

Also in accordance with the invention, a plurality of analog stores each as set forth in the preceding paragraph are combined so as to share (i) the arm connected to the source terminal of each transistor, (ii) the other arm connected to that arm, and (iii) the source of the alternating reference voltage, switching means being provided for applying the command signal cyclically and repetitively to the gate electrode of each transistor.

Alternatively, where the means for applying the command signal includes another high-gain negative-feedback amplifier, the biasing means may include connections from the said other electrode of the capacitor and from the mid-potential point of said arm connected to the source terminal to the inverting and non-inverting input terminals respectively of the said other amplifier, thereby causing the capacitor to act also as the negative-feedback path for that amplifier.

Also in accordance with the invention, a plurality of analog stores each as set forth in the preceding paragraph are combined so as to share (i) the arm connected to the source terminal of each transistor, (ii) the other arm connected to that arm connected to that arm, (iii) the source of the alternating reference voltage, and (iv) the said other high-gain negative-feedback amplifier, switching means being provided for applying the output from the said other amplifier cyclically and repetitively to the gate electrode of each transistor and at each such application causing the associated capacitor to serve also as the feedback path of that amplifier.

Figure 2:
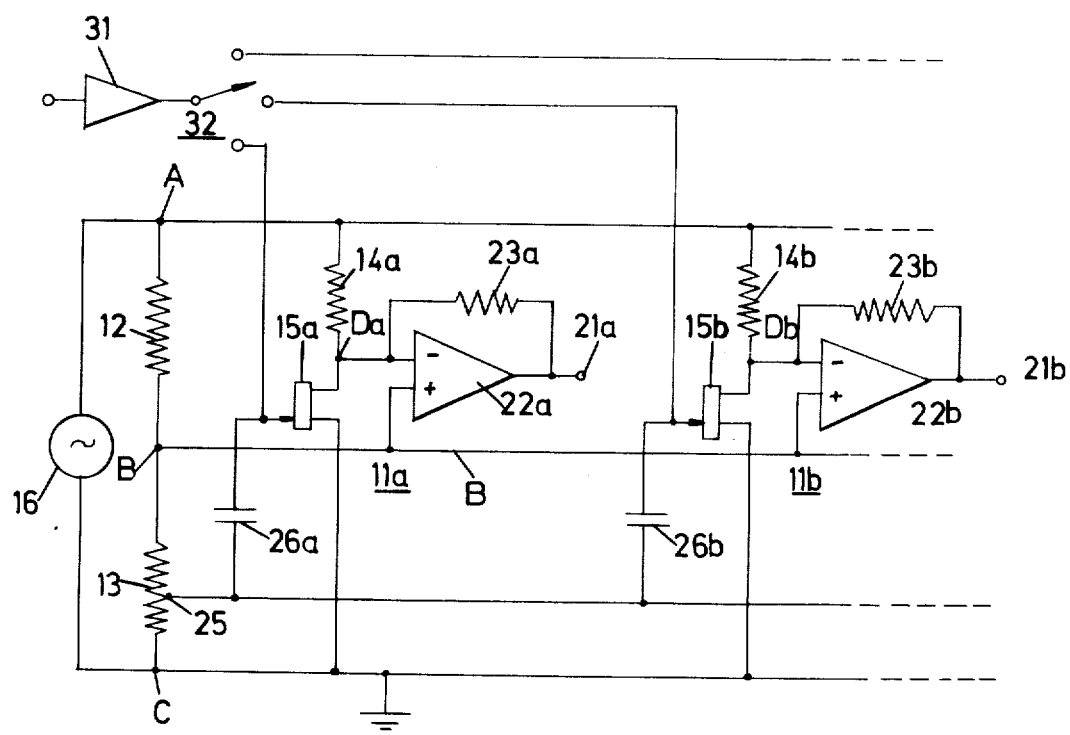
Figure 3:
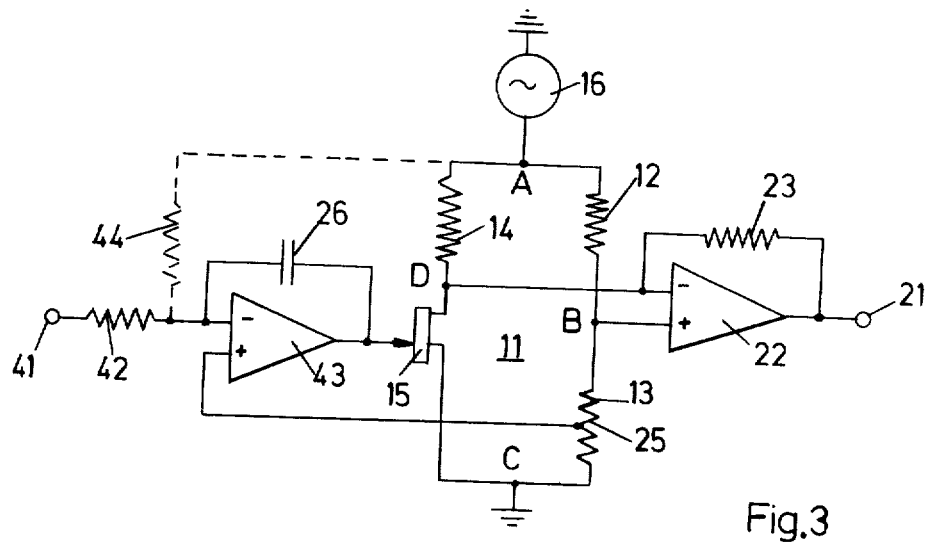
Figure 4:
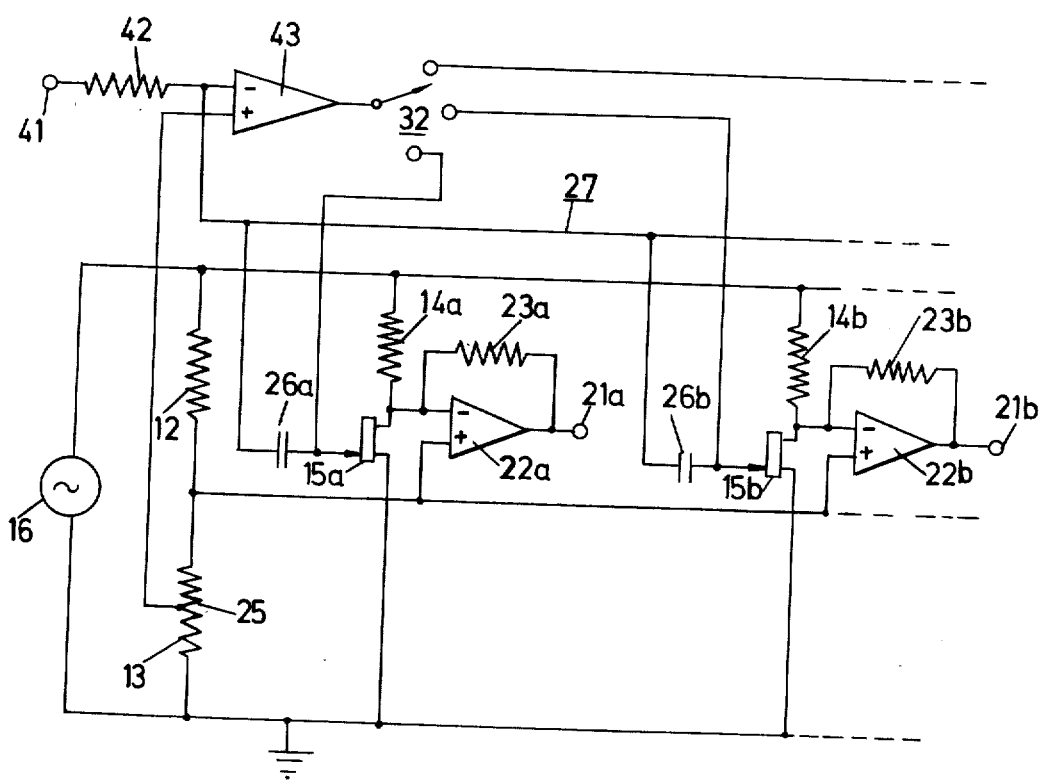

In the accompanying drawings,

FIGS. 1 and 3 are schematic circuit diagrams of an analog store in accordance with two embodiments of the invention, FIG. 2 shows two of the stores of FIG. 1, and FIG. 4 shows two of the stores of FIG. 3, in each case combined in accordance with further embodiments.

In carrying out the invention in accordance with the embodiment of FIG. 1 by way of example, an analog store 11 suitable for combining with others like it on a time-sharing basis includes a four-arm resistance bridge, the effective points of which are indicated at A, B, C, and D.

The arms AB, BC, and AD take the form of ohmic resistors 12, 13 and 14. The remaining arm CD takes the form of the drain/source path of a field-effect transistor (FET) 15, the drain and source terminals being connected to the points D and C respectively, and the point C being earthed.

Resistors 12 and 14 have like resistance values which are fairly high compared with the resistance of resistor 13. The latter's resistance is to some extent determined by the mean resistance of the drain/source path at the FET. In a particular application, resistors 12 and 14 were 3K and a resistor 13 66 ohms.

A source 16 of alternating voltage is applied across the diagonal AC of the bridge. The frequency of this alternating voltage must, of course, be within the bandwidth of the associated circuitry.

The output to a terminal 21 is derived from the other diagonal BD by way of a high-gain negative-feedback amplifier 22 having a resistor 23 to provide the feedback path. Of the two input terminals the inverting and non-inverting ones are connected to points D and B respectively.

The DC command input signal to the bridge is applied by way of a terminal 24 to the gate electrode of the FET, to which is also connected the mid-point 25 of resistor 13 by way of a capacitor 26.

In operation, when the bridge is energised by the AC voltage of source 16 and the charge held by capacitor 26 has a datum value, the voltage developed across it plus the AC voltage of the earthed half of resistor 13 so energises the gate electrode of transistor 15 as to cause the bridge to balance and provide at terminal 21 a zero output. The value of resistor 13 is chosen to ensure this. Subject to perhaps slight leakage from the capacitor, this charge is held and the balance of the bridge maintained until the next command signal arrives.

The arrival at terminal 24 of a DC command signal which requires an AC signal to be stored, causes capacitor 26 to depart from the datum value to take up and retain a new value of the charge the extent and sense of which with respect to the datum value are dependent on the AC signal to be stored.

The resulting unbalance of the bridge, with points B and D tending to different potentials, causes amplifier 22 to develop a high enough feedback voltage to restore them to substantial equality. The output which the amplifier thus delivers to terminal 21 is the required alternating voltage the phase of which with respect to that of source 16 and the amplitude of which are dependent on the direction and extent of the departure from the datum value of the charge held by capacitor 26 in obedience to the command signal.

This output voltage retains that sense and value so long as capacitor 26 retains the charge that the command signal imposed on it. Thus the circuit 11 acts in effect as an AC store, though the actual storage is effected by the capacitor.

The result of keeping points B and D at the same potential causes the voltage across resistor 13 to remain equal to that between the drain and source terminals of the transistor 15. Hence the bias potential applied from the mid-point 25 of resistor 13 to the gate electrode by way of capacitor 26 is maintained at half the drain/source voltage. As explained above, such a bias is sufficient to render inappreciable the generation of unwanted harmonics due to non-linearity of the relationship between those terminals. This allows the FETs to be operated with a much larger voltage across the drain/source path and so results in a much improved signal-to-noise ratio.

FIG. 2 shows part of a combination of such stores as store 11 on a time-sharing basis. Only two stores, labelled 11a and 11b are shown. Such parts of the stores as correspond to those described with reference to FIG. 1 are given the same reference numbers followed by the suffixes a or b where the component is not shared.

It will be seen from the diagram that the components which are shared are resistors 12 and 13 and the source 16 of the AC reference voltage. The "earthy" electrodes of the capacitors are connected direct to the mid-point 25 of the shared resistor 13 by way of a common lead 27.

The command signal, derived from an operational amplifier 31, is applied by way of switching means 32 (of some electronic kind) to the gate electrodes of the FETs 15a, 15b, etc., and associated capacitors 26a, 26b, etc., in turn, each capacitor retaining the charge last applied to it until the command signal comes round again to update it.

For each store, the bridge configuration remains essentially the same as before, and the previous reference letters A to D have been inserted to show this. Though A, B and C are shared, the point Da, Db, etc., between the resistor 14a, 14b, etc., and the associated FET remains individual to each store.

In each store, the feedback amplifier acts as before to maintain the voltage across the FET equal to that across resistor 13; and although the voltage across resistor 13 has a constant amplitude, the amount of feedback and hence the value of the stored AC signal may be different from store to store according to the different values of the DC signals applied to the FET gates as required by the command signals.

Thus as the drain/source voltages are all the same, the voltage across half the resistor 13 has in each case the correct value for minimising unwanted harmonics.

Where a store is part of a servo loop as briefly described above, and the integrator which derives from the demodulator the DC signal for the capacitor is of the so-called Miller feedback kind, the arrangement of FIG. 1 may be modified as shown in FIG. 3 to allow the capacitor which retains the DC command signal to act also as the feedback path. Components corresponding to those of FIG. 1 are given their previous references.

The rectified signal from the demodulator (not shown) is applied by way of a resistor 42 to the inverting input terminal of the integrator — a high-gain amplifier 43, for which the capacitor 26 is used as the Miller feedback. The mid-point 25 of resistor 13 is applied to the non-inverting input. The output from the integrator is applied to the gate of FET 15. The rest of the bridge is the same as before.

In operation, on the arrival at terminal 41 of a command signal from the demodulator, amplifier 43 develops sufficient feedback current through capacitor 26 to maintain the inverting input terminal at substantially the same potential as its non-inverting input, thereby effectively connecting the earthy electrode of the capacitor — its left-hand plate, as seen in the drawing — again to the mid-point of resistor 13. As a further result, the capacitor acquires the appropriate charge necessary to maintain the resistance of the drain/source path of the FET 15 to produce the commanded AC output from terminal 21.

The increase in the servo follow-up speed using a store in accordance with the invention is such that the commanded amplitude of the stored AC signal has been found to be reached in a less time than the period of the AC reference voltage from source 16.

It may sometimes happen that a slight error in the integrated output from amplifier 43 may occur because of a flow of current through resistor 42 towards the modulator in response to the voltage at the inverting input terminal of the integrating amplifier 43. Such current would be maintained by the feedback through capacitor 26 and so result in an error in the output from the amplifier. Where the update period of the store is equal to a whole number of cycles of the alternating reference voltage, this error is integrated to zero at the output of amplifier 43. Nevertheless, such an error can most readily be corrected by feeding current to the inverting input terminal of the amplifier by way of a resistor 44 from the reference source 16 as indicated in broken lines.

FIG. 4 shows a convenient combination of stores of the FIG. 3 kind, only two stores being depicted. The arrangement is very similar to that of FIG. 2 except that the common lead 27 to which the earthy electrodes of the capacitors are connected is no longer connected to centre point 25 but instead to the inverting input of the integrator.

An effective "step" of the switch 32 not only applies the command signal to an FET gate but also serves to connect across the integrator the capacitor associated with that FET.

What we claim is:

1. An analog store for producing an alternating output voltage of amplitude dependent on a command signal, which includes a four-arm resistance bridge in which the resistance of one arm is constituted by the drain/source path of a field-effect transistor and hence is variable in dependence on the gate/source voltage, arrangements for energising the bridge across one diagonal by an alternating voltage, means for deriving the output from the bridge from the other diagonal by way of a high-gain negative-feedback amplifier so as to maintain the voltage between the drain and source terminals of the transistor equal to the voltage across the arm connected to the source terminal despite variations of the resistance of the drain/source path, a capacitor having one electrode connected to the gate electrode, means for applying the command signal to that gate electrode, and biasing means for applying to the other electrode of the capacitor a voltage with respect to the source terminal of the transistor which is equal to half the voltage developed across the said arm connected to that terminal.

2. A store as claimed in claim 1 in which the biasing means comprise a connection from the mid-potential point of said arm connected to the source terminal to the said other electrode of the capacitor direct.

3. A store as claimed in claim 1 which includes means for applying the command signal comprising another high-gain negative-feedback amplifier, and in which the biasing means include connections from the said other electrode of the capacitor and from the mid-potential point of said arm connected to the source terminal to the inverting and non-inverting input terminals respectively of the said other amplifier, thereby causing the capacitor to act as the negative-feedback path for that amplifier.

4. A plurality of analog stores each as claimed in claim 1 so as to share (i) the arm connected to the source terminal of each transistor, (ii) the other arm connected to that arm, and (iii) the source of the alternating reference voltage, switching means being provided for applying the command signal cyclically and repetitively to the gate electrode of each transistor.

5. A plurality of analog stores each as claimed in claim 3 combined so as to share (i) the arm connected to the source terminal of each transistor, (ii) the other arm connected to that arm, (iii) the source of the alternating reference voltage, and (iv) the said other high-gain negative-feedback amplifier, switching means being provided for applying the output from the said other amplifier cyclically and repetitively to the gate electrode of each transistor and at each such application causing the associated capacitor to serve also as the feedback path of that amplifier.

6. An analog store as claimed in claim 1 in which the alternating reference voltage is of constant frequency.

* * * * *